US011728832B2

(12) United States Patent
Lin

(10) Patent No.: US 11,728,832 B2
(45) Date of Patent: Aug. 15, 2023

(54) INTERFACE CIRCUITRY WITH CURRENT REUSE MECHANISM

(71) Applicant: Artilux, Inc., Menlo Park, CA (US)

(72) Inventor: Shao-Hung Lin, Hsinchu County (TW)

(73) Assignee: ARTILUX, INC., Menlo Park, CA (US)

( * ) Notice: Subject to any disclaimer, the term of this patent is extended or adjusted under 35 U.S.C. 154(b) by 313 days.

(21) Appl. No.: 17/031,810

(22) Filed: Sep. 24, 2020

(65) Prior Publication Data

US 2021/0099192 A1 Apr. 1, 2021

Related U.S. Application Data

(60) Provisional application No. 62/906,108, filed on Sep. 26, 2019.

(51) Int. Cl.
*H04B 1/04* (2006.01)
*G05F 1/56* (2006.01)
*H03F 3/45* (2006.01)

(52) U.S. Cl.
CPC ............... *H04B 1/04* (2013.01); *G05F 1/56* (2013.01); *H03F 3/45475* (2013.01)

(58) Field of Classification Search
CPC .......... H04B 1/04; H03F 3/45475; G05F 1/56
USPC ........................................................ 375/295
See application file for complete search history.

(56) References Cited

U.S. PATENT DOCUMENTS

| 2012/0025800 A1* | 2/2012 | Dettloff ............... H04L 25/0272 323/299 |
| 2016/0298152 A1* | 10/2016 | Buller .................... C12P 13/227 |
| 2019/0074910 A1* | 3/2019 | Seo ......................... H04B 10/69 |

* cited by examiner

*Primary Examiner* — Kevin M Burd
(74) *Attorney, Agent, or Firm* — Dority & Manning, P.A.

(57) ABSTRACT

An interface circuitry includes an interface, a transmitter module and a receiver module. The transmitter module includes an input stage, a driving circuit and a regulator circuit. The input stage is powered by a regulated voltage and configured to receive an input signal and generate a first output signal and a second output signal. The driving circuit is configured to drive the interface according to the first output signal and the second output signal and to provide a first data signal, a second data signal and a driving signal. The regulator circuit is coupled between the input stage and the driving circuit, and configured to provide the supply voltage according to the driving current.

17 Claims, 10 Drawing Sheets

INTERFACE CIRCUITRY WITH CURRENT REUSE MECHANISM

CROSS REFERENCE TO RELATED APPLICATIONS

This application claims benefit of U.S. provisional Application No. 62/906,108 filed on 2019 Sep. 26.

BACKGROUND

This specification relates to an interface circuitry, and more particularly, to an interface circuitry with current reuse mechanism.

High-speed interfaces are used for transmitting high-quality and high-bandwidth streams of audio and video data from a source device to a video display device, such as a high-definition multimedia interface (HDMI), a USB interface, a DisplayPort (DP) interface or a peripheral component interconnect express (PCIE) interface.

During operation, an active cable (e.g., HDMI cable) will be connected between a source device (e.g., BD-Player, game console, laptop or personal computer) and a sink device (e.g., TV or monitor), where the interface circuitries located at the two ends of the cable will consume power based on the amount of transmitted data and/or the speed of the audio and video stream. Typically, the power provided to the interface circuitry at the source side of the cable is generated from the source device and the power provided to the interface circuitry at the sink side of the cable is generated from the sink device. However, the amount of power provided to the interface circuitries either in source side or sink side of the cable are not unlimited.

Specifically, the interface circuitry in sink side of the cable has to drive the receiving circuit in the sink device, which includes some functional blocks, such as transimpedance amplifier, limiting amplifier or driving circuit. In conventional approaches, these functional blocks are independently coupled to a power source, which may cause higher power consumption. Therefore, this application provides a low power interface circuitry by using current reuse mechanism.

SUMMARY

The present disclosure provides an interface circuitry which includes an interface and a transmitter module. The transmitter module includes an input stage, a driving circuit and a regulator circuit. The input stage is powered by a regulated voltage and configured to receive an input signal and generate a first output signal and a second output signal. The driving circuit is configured to drive the interface according to the first output signal and the second output signal and to provide a first data signal, a second data signal and driving current. The regulator circuit is coupled between the input stage and the driving circuit, and configured to provide the regulated voltage according to the driving current.

The details of one or more implementations are set forth in the accompanying drawings and the description below. Other potential features and advantages will become apparent from the description, the drawings, and the claims.

DETAILED DESCRIPTION

Figure 1:
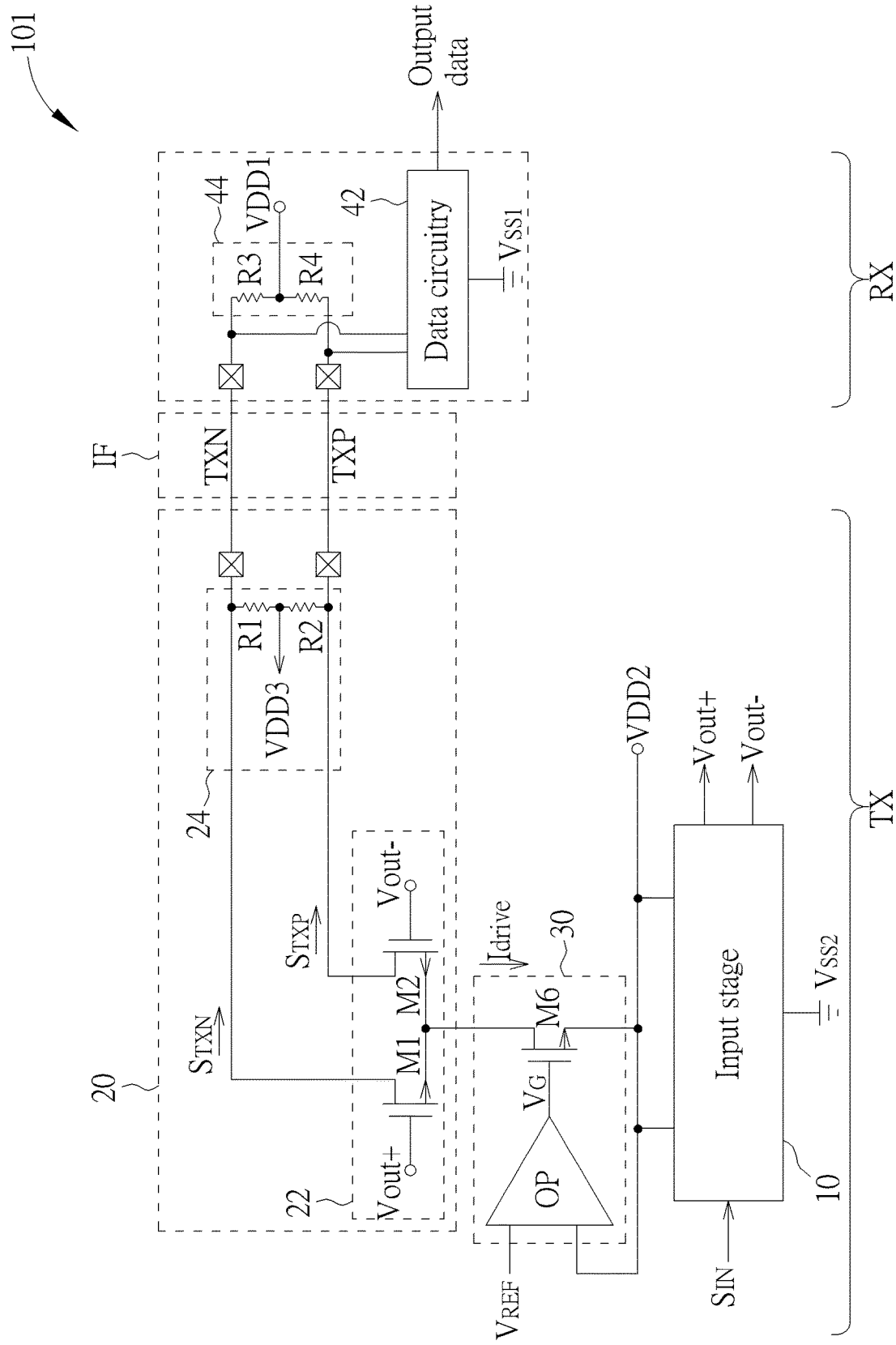
FIG. 1 is a diagram illustrating a DC-coupled interface circuitry with current reuse mechanism.

FIGS. 1-5 are the diagrams illustrating DC-coupled interface circuitries 101-105 with current reuse mechanism. FIGS. 6-10 are the diagrams illustrating AC-coupled interface circuitries 106-110 with current reuse mechanism. In some embodiments, each of the DC-coupled interface circuitries 101-105 and the AC-coupled interface circuitries 106-110 includes a transmitter module TX, a receiver module RX, and an interface IF. The transmitter module TX is implemented on a sink side of a cable and the receiver module RX is implemented in a sink device. The transmitter module TX is configured to transmit data (e.g., audio data, video data or control data) over the interface IF (e.g., HDMI/USB/DP/PCIE) to the receiver module RX.

In the DC-coupled interface circuitries 101-105, the receiver module RX may receive a supply voltage VDD1 generated from the sink device for operation. When the receiver module RX is DC-coupled with the transmitter module TX via the interface IF, the supply voltage VDD1 will be transmitted to the transmitter module TX and used as a supply voltage. In addition, as the power of the transmitter module TX can be provided from the receiver module RX, a supply voltage VDD3 can be established based on the supply voltage VDD1 to be used as a supply voltage in the transmitter module TX. In some DC-coupled embodiments, the interface IF can be one or more pins of HDMI interface which includes a signal transmission line TXN and a signal transmission line TXP.

In the AC-coupled interface circuitries 106-110, the receiver module RX may receive a supply voltage VDD1 for operation and the transmitter module TX may receive a supply voltage VDD3 to supply its operation. As the interface IF is an AC-coupled interface, the interface IF will not transmit DC signal between the transmitter module TX and the receiver module RX. Therefore, the supply voltage VDD1 and the supply voltage VDD3 are provided independently. In one embodiment, the supply voltage VDD1 is generated from the sink device and the supply voltage VDD3 is generated from the source device. In some AC-coupled embodiments, the interface IF may be one or more pins of a USB interface, a DP interface or a PCIE interface which includes a signal transmission line TXN and a signal transmission line TXP.

In the embodiments illustrated in FIGS. 1-10, each transmitter module TX in the DC-coupled interface circuitries 101-105 and the AC-coupled interface circuitries 106-110 includes an input stage 10, a driving circuit 20 and a regulator circuit 30. The input stage 10 is configured to receive an input signal $S_{IN}$ and generate output signals $V_{OUT+}$ and $V_{OUT-}$ to the driving circuit 20. In an embodiment, the input signal $S_{IN}$ can be an electrical signal or an optical signal, which comes from the source side of the cable, and the output signals $V_{OUT+}$ and $V_{OUT-}$ are collectively formed a differential signal.

In some embodiments, the transmitter module TX may include one or more regulators implemented between different functional blocks (e.g., transimpedance amplifier, limiting amplifier or driving circuit) or within one functional block. For example, one regulator can be implemented between the driving circuit 20 and the limiting amplifier 14, and another regulator can be implemented between the limiting amplifier 14 and the transimpedance amplifier 12.

The driving circuit 20 includes a differential driver 22 and a termination load circuit 24. The differential driver 22, including transistors M1 and M2, is configured to provide a low-swing and high-speed differential signal over the signal transmission lines TXN and TXP. More specifically, the driving circuit 20 can respectively generate the data signals $S_{TXN}$ and $S_{TXP}$ based on the output signals $V_{OUT+}$ and $V_{OUT-}$ outputted by the input stage 10, thereby transmitting the data signals $S_{TXN}$ and $S_{TXP}$ from the transmitter module TX to the receiver module RX. The transistor M1 includes a first end for outputting the data signal $S_{TXN}$ to the signal transmission line TXN, a second end for outputting the driving current $I_{drive}$ to the regulator circuit 30, and a control end for receiving the output signal $V_{OUT+}$. The transistor M2 includes a first end for outputting the data signal $S_{TXP}$ to the signal transmission line TXP, a second end for outputting the driving current $I_{drive}$ to the regulator circuit 30, and a control end for receiving the output signal $V_{OUT-}$. The resistors R1 and R2 in the termination load circuit 24 are coupled in series between the signal transmission lines TXN and TXP for being an impendence match.

The regulator circuit 30 includes an operational amplifier OP and a transistor M6. The transistor M6 includes a first end coupled to the second ends of the transistors M1 and M2 for receiving the driving current $I_{drive}$, a second end coupled to the input stage 10 for providing a regulated voltage VDD2, and a control end coupled to the operational amplifier OP for receiving a control signal $V_G$. The operational amplifier OP includes a positive input end for receiving a reference voltage $V_{REF}$, a negative input end coupled to the second end of the transistor M6 for receiving the regulated voltage VDD2, and an output end for outputting the control signal $V_G$. During operation, the driving current $I_{drive}$ will be generated from the differential driver 22 in the driving circuit 20 and sinks to the regulator circuit 30. The operational amplifier OP is configured to generate the control signal $V_G$ according to the reference voltage $V_{REF}$ and the regulated voltage VDD2. With this structure, the driving current $I_{drive}$ generated from the differential driver 22 can be reused to provide the input stage 10 in connection with the regulated voltage VDD2, instead of flowing to the ground directly. As such, the power consumption can be reduced.

In some embodiments, each of the transistors M1, M2 and M6 can be implemented by a metal-oxide-semiconductor field-effect transistor (MOSFET), a bipolar junction transistor (BJT) or any another device with similar function. In some embodiments, the transistor M6 can be implemented by a power transistor, where the voltage tolerance of the transistor M6 is higher than that of the transistor M1 or M2.

In some embodiments, the receiver module RX includes a data circuitry 42 and a termination load circuit 44. The data circuitry 42 and the termination load circuit 44 can be powered by the supply voltage VDD1 in the sink device. The termination load circuit 44, including resistors R3 and R4, is configured to receive the data signals $S_{TXN}$ and $S_{TXP}$ via the transmission lines TXN and TXP. The data circuitry 42 is configured to receive data signals $S_{TXN}$ and $S_{TXP}$ via the transmission lines TXN and TXP and process the received data signals TXN and TXP to produce output data.

Figure 2:
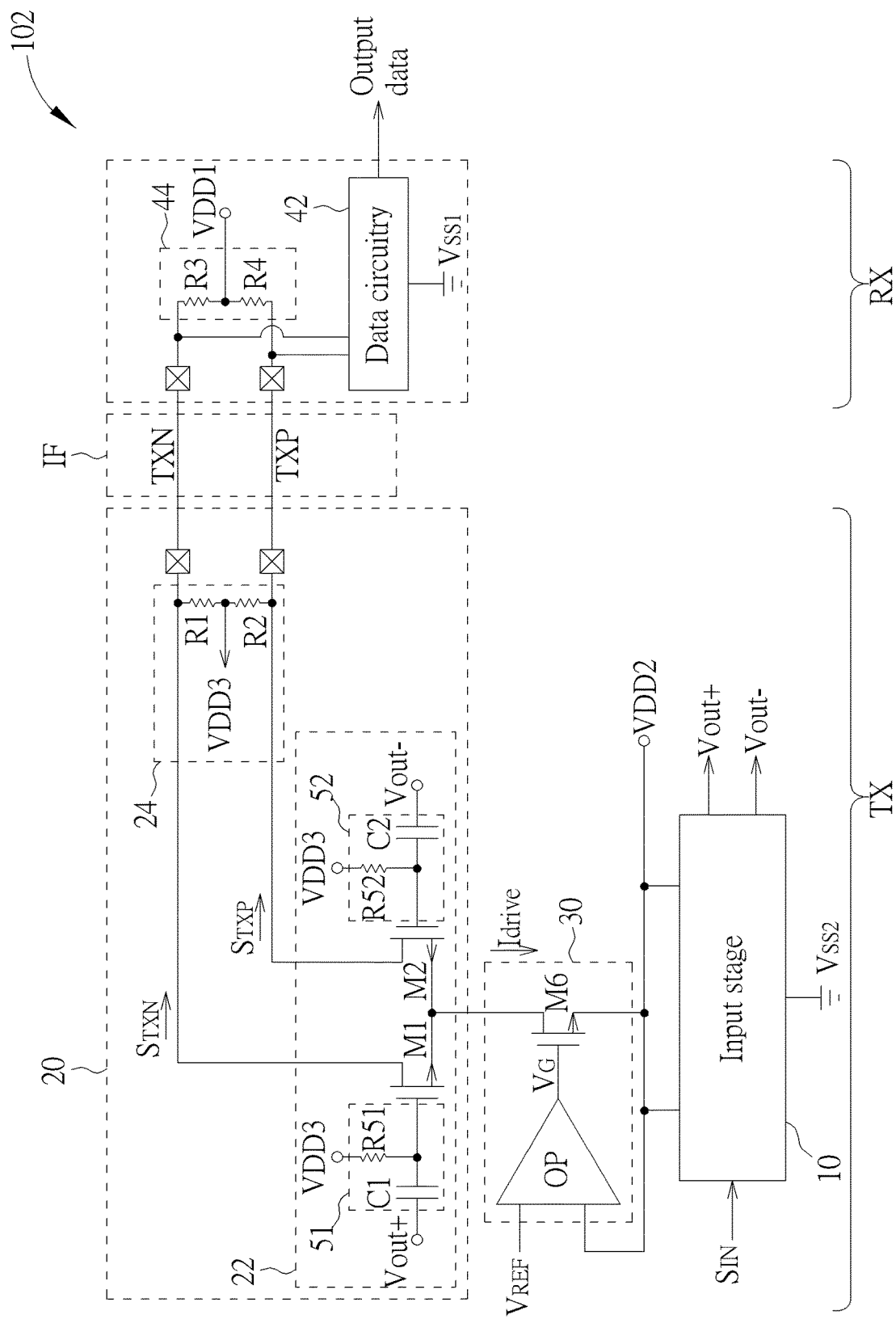
FIG. 2 is a diagram illustrating a DC-coupled communications interface circuitry with current reuse mechanism.
Figure 7:
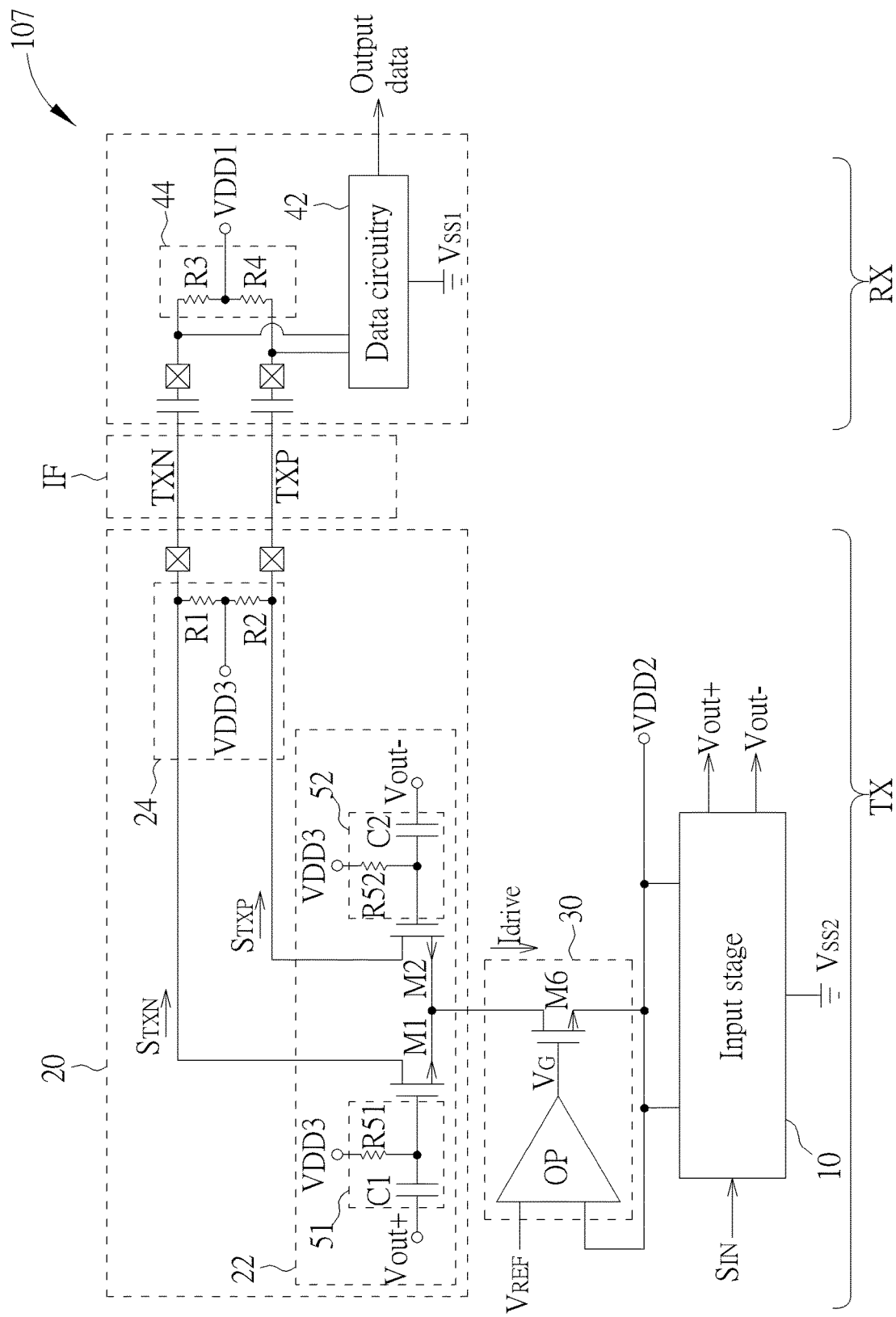
FIG. 7 is a diagram illustrating an AC-coupled interface circuitry with current reuse mechanism.

In the embodiments illustrated in FIG. 2 and FIG. 7, the driving circuit 20 of the DC-coupled interface circuitry 102 or the AC-coupled interface circuitry 107 further includes AC coupling units 51 and 52. The AC coupling unit 51 is configured to allow the transistor M1 to operate within a predetermined range, and the AC coupling unit 52 is configured to allow the transistor M2 to operate within a predetermined range. In an embodiment, the AC coupling unit 51 includes a capacitor C1 and a resistor R51, and the AC coupling unit 52 includes a capacitor C2 and a resistor R52. The capacitor C1 is coupled between the control end of the transistor M1 and the output signal $V_{OUT+}$, and the resistor R51 is coupled between the control end of the transistor M1 and the supply voltage VDD3. The capacitor C2 is coupled between the control end of the transistor M2 and the output signal $V_{OUT-}$, and the resistor R52 is coupled between the control end of the transistor M2 and the supply voltage VDD3.

Figure 3:
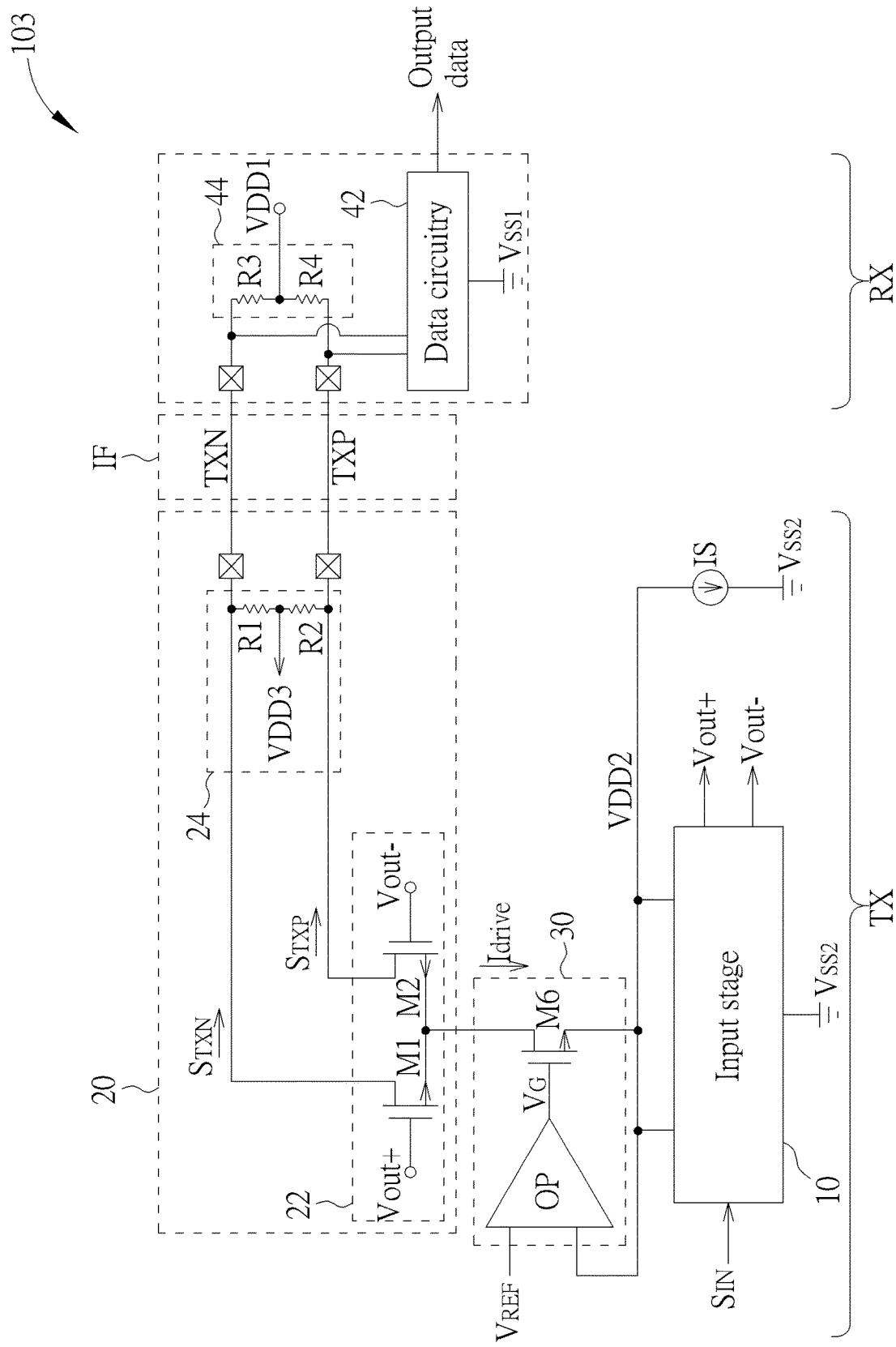
FIG. 3 is a diagram illustrating a DC-coupled interface circuitry with current reuse mechanism.
Figure 8:
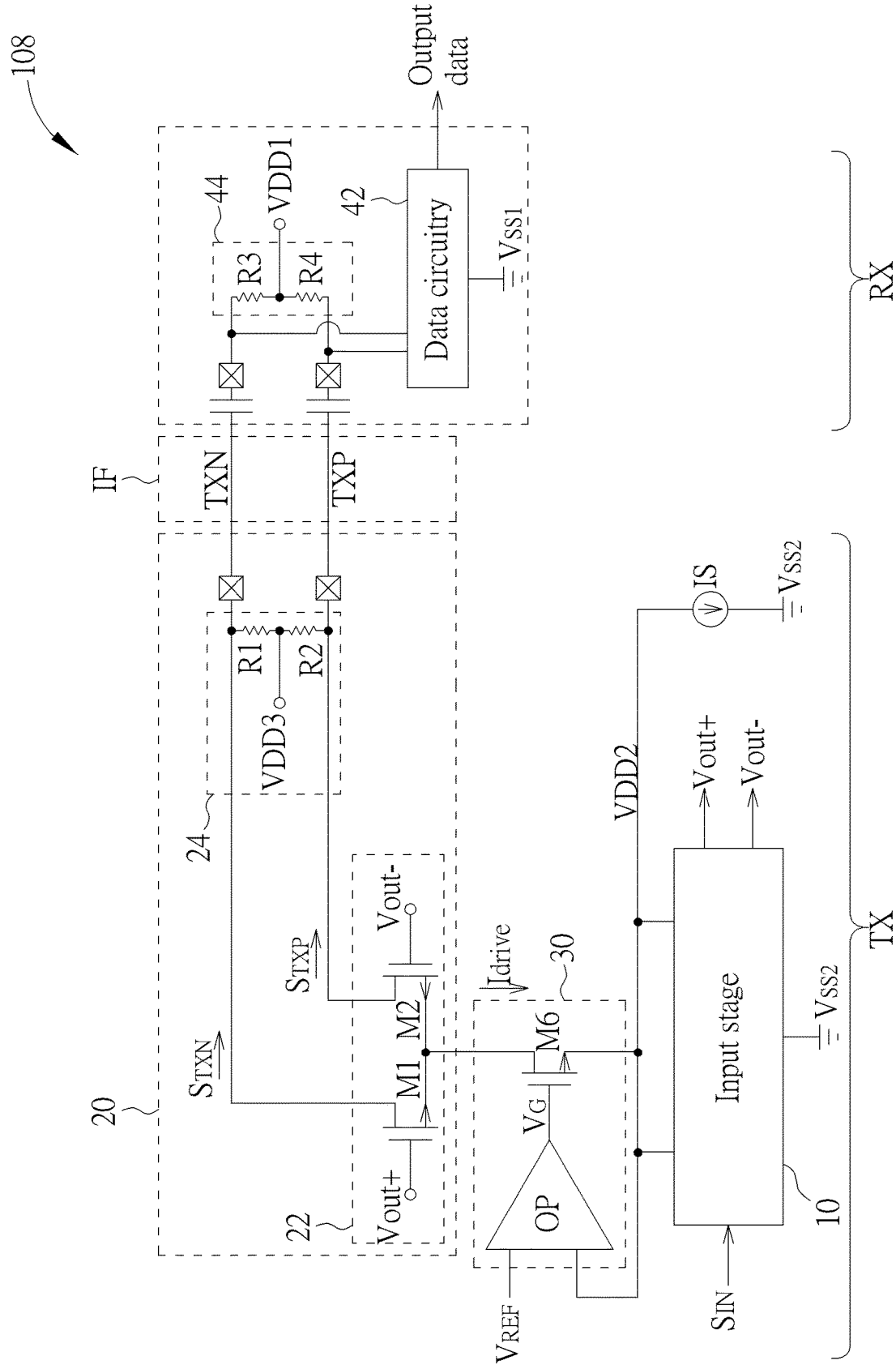
FIG. 8 is a diagram illustrating an AC-coupled interface circuitry with current reuse mechanism.

In the embodiments illustrated in FIGS. 3 and 8, the DC-coupled interface circuitry 103 or the AC-coupled interface circuitry 108 further includes an adjustable current source IS coupled between the regulated voltage VDD2 and a ground voltage VSS2. In some embodiments, the adjustable current source IS can be coupled to the regulated voltage VDD2 and a predetermined voltage which is higher than the regulated voltage VDD2. The adjustable current source IS is configured to regulate the driving current $I_{drive}$ to maintain the data signals $S_{TXN}$ and $S_{TXP}$ operated at predetermined ranges. In some embodiments, the driving circuit 20 of the DC-coupled interface circuitry 103 or the AC-coupled interface circuitry 108 may further include AC coupling units 51 and 52 in the same configuration as illustrated in FIG. 2 or FIG. 7.

Figure 4:
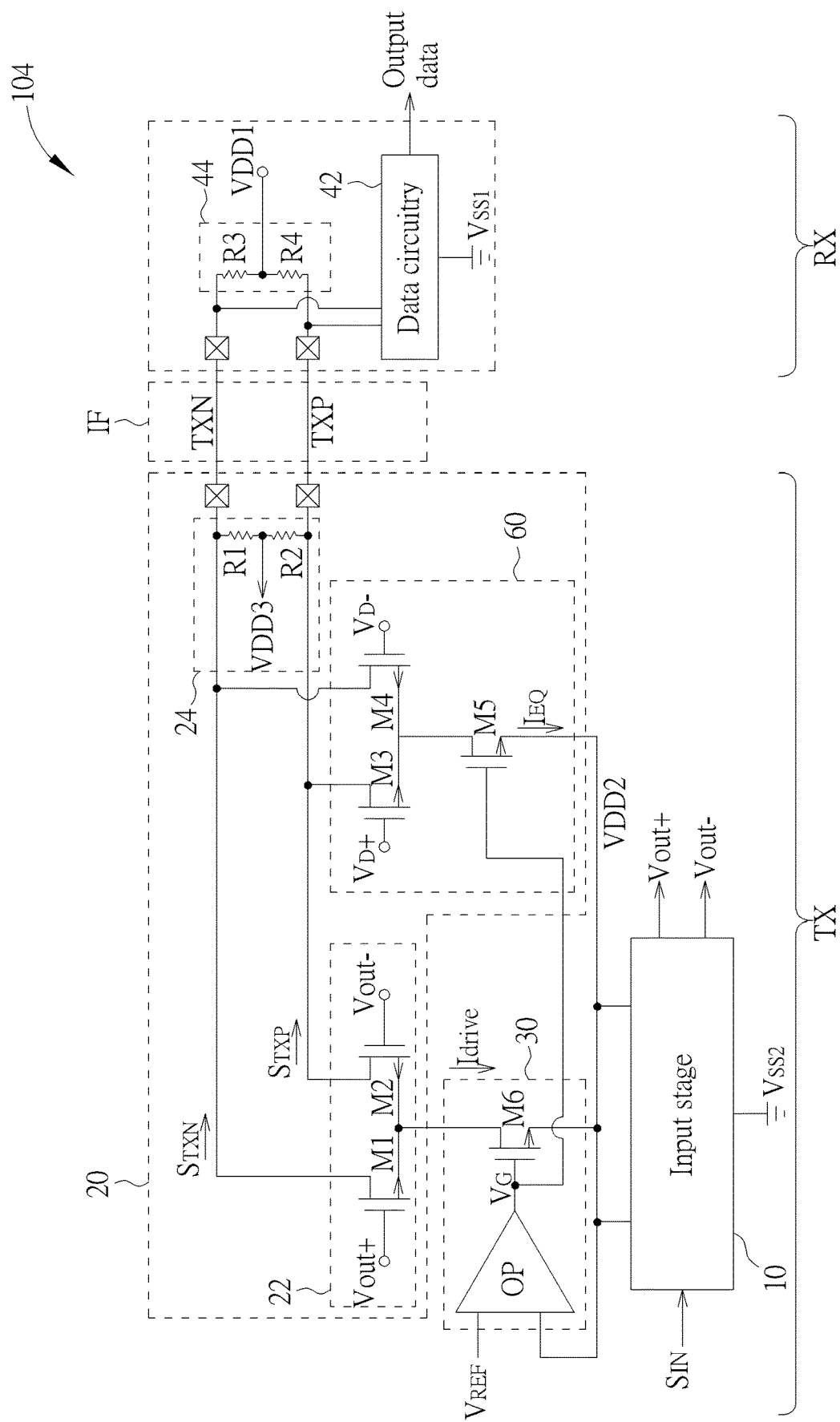
FIG. 4 is a diagram illustrating a DC-coupled interface circuitry with current reuse mechanism.
Figure 9:
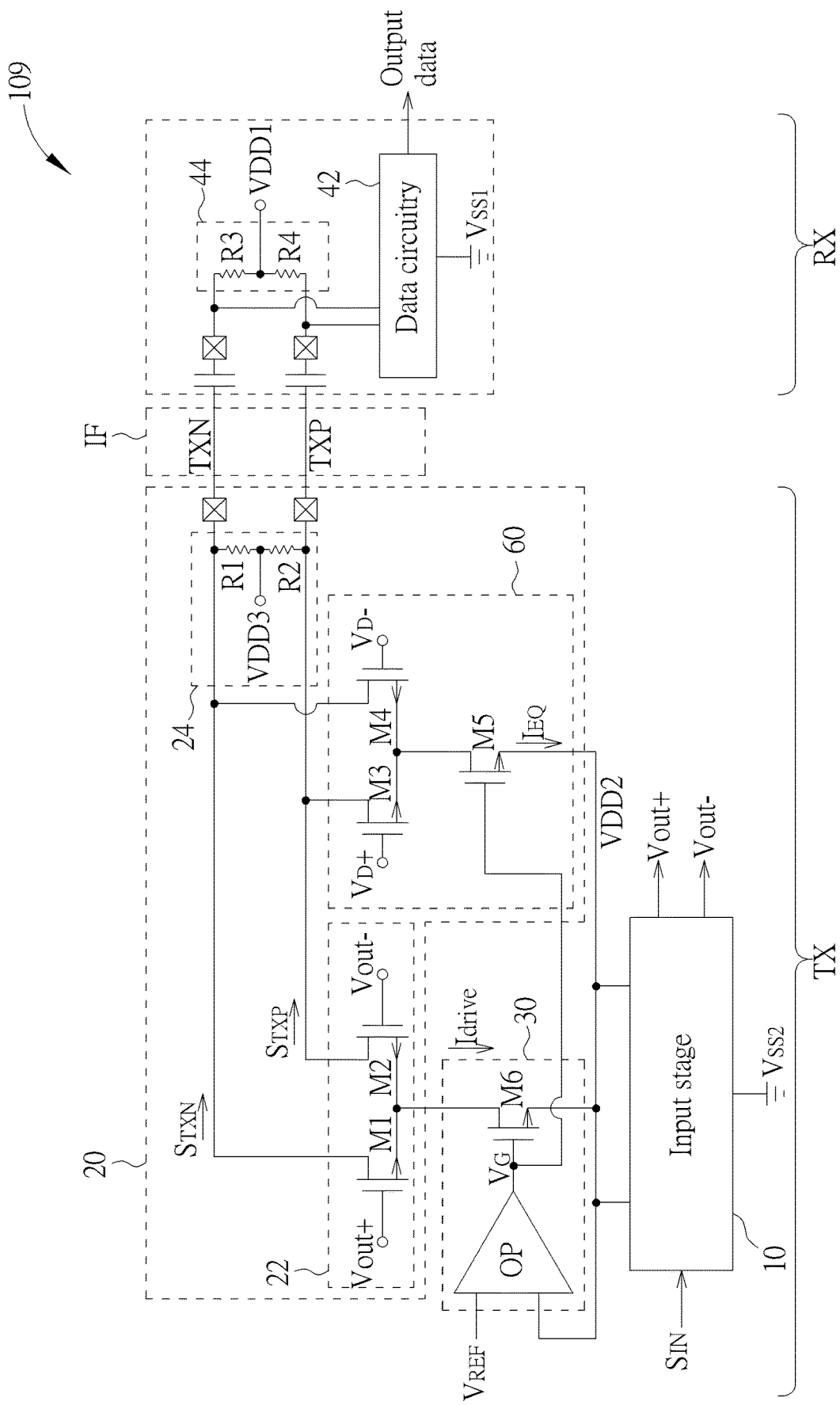
FIG. 9 is a diagram illustrating an AC-coupled interface circuitry with current reuse mechanism.

In the embodiments illustrated in FIGS. 4 and 9, the driving circuit 20 of the DC-coupled interface circuitry 104 or the AC-coupled interface circuitry 109 further includes an equalizer 60. The equalizer 60, including transistors M3-M5, is configured to perform de-emphasis function on the data signals $S_{TXN}$ and $S_{TXP}$. The transistor M3 includes a first end coupled to the signal transmission line TXP, a second end, and a control end coupled to receive a delay signal $V_{D+}$. The transistor M4 includes a first end coupled to the signal transmission line TXN, a second end, and a control end coupled to receive a delay signal $V_{D-}$. The transistor M5 includes a first end coupled to the second ends of the transistors M3 and M4, a second end coupled to the second end of the transistor M6, and a control end coupled to the control end of the transistor M6. The delay signals $V_{D+}$ and $V_{D-}$ may be generated and controlled by a delay circuit (not shown in FIGS. 4 and 9) according to the output signals $V_{OUT+}$ and $V_{OUT-}$ respectively. More specifically, a predetermined time delay is introduced between the delay signals $V_{D+}$ and the output signal $V_{OUT+}$ and a predetermined time delay is introduced between the delay signals $V_{D-}$ and the output signal $V_{OUT-}$. Since the transistors M3 and M4 are operated with the predetermined time delay with respect to the transistors M1 and M2, the transistor M5 is accordingly driven to generate an equalization current $I_{EQ}$ to establish the regulated voltage VDD2. The equalizer 60 can improve the signal to noise ratio of signal reception in the DC-coupled interface circuitry 104 and the AC-coupled interface circuitry 109.

In some embodiments, each of the transistors M3-M5 can be a MOSFET, a BJT or any other device with similar function.

In some embodiments, the driving circuit 20 of the DC-coupled interface circuitry 104 or the AC-coupled interface circuitry 109 may further include four AC coupling units respectively coupled to the control ends of the transistor M1-M4 in similar configuration as illustrated in FIG. 2 or FIG. 7.

In some embodiments, the DC-coupled interface circuitry 104 or the AC-coupled interface circuitry 109 may further include an adjustable current source in the same configuration as illustrated in FIG. 3 or FIG. 8.

Figure 5:
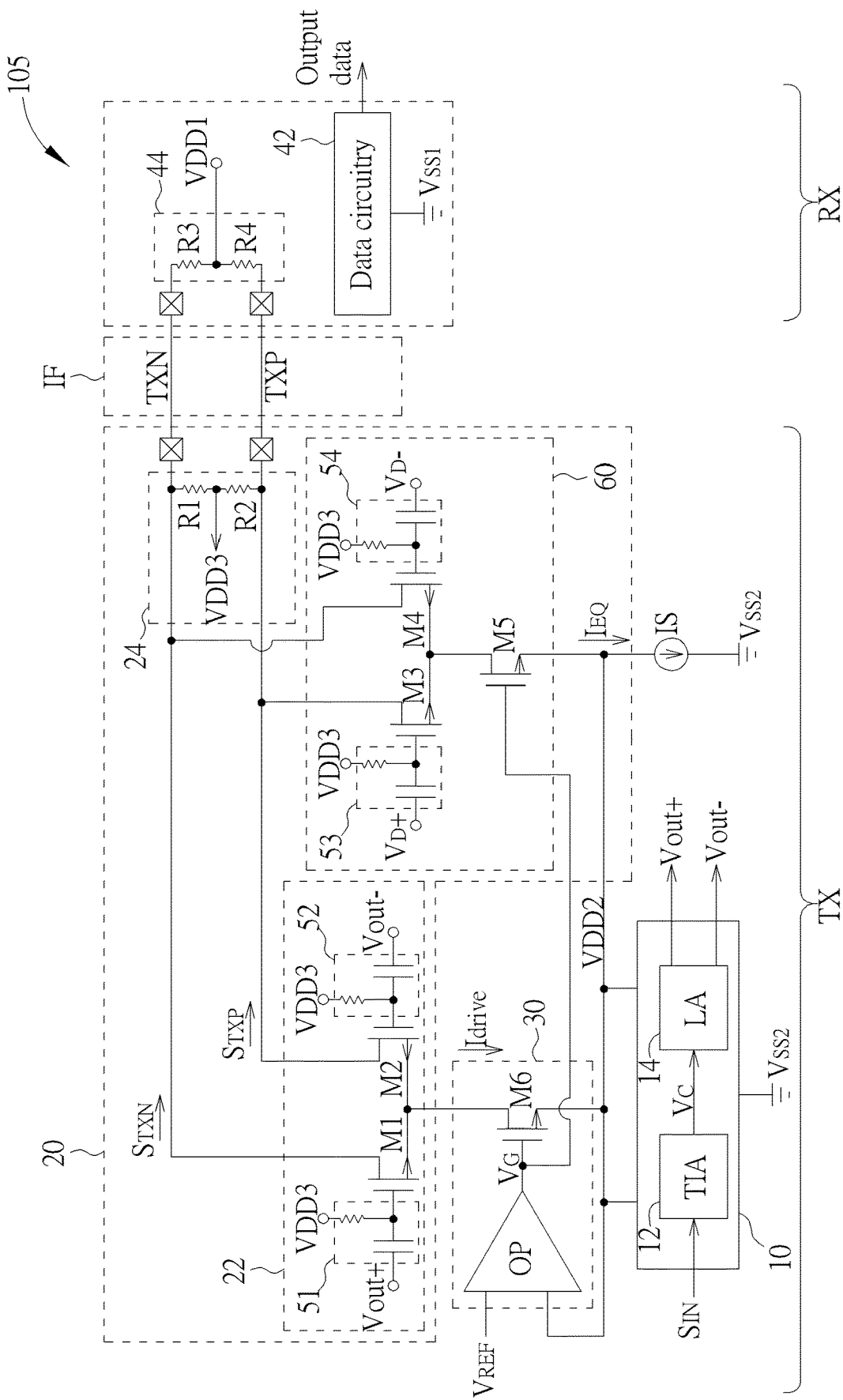
FIG. 5 is a diagram illustrating a DC-coupled interface circuitry with current reuse mechanism.
Figure 6:
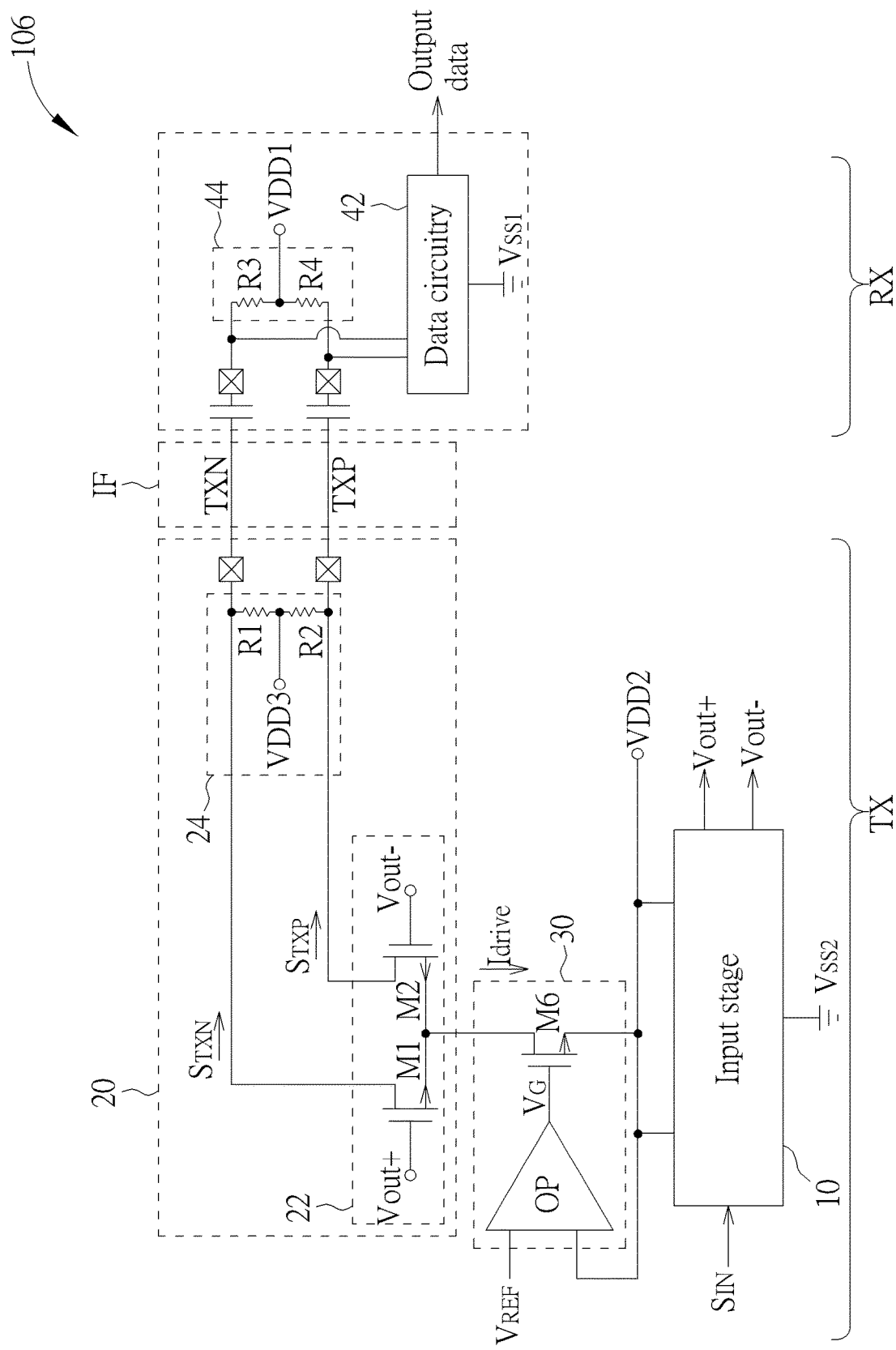
FIG. 6 is a diagram illustrating an AC-coupled interface circuitry with current reuse mechanism.
Figure 10:
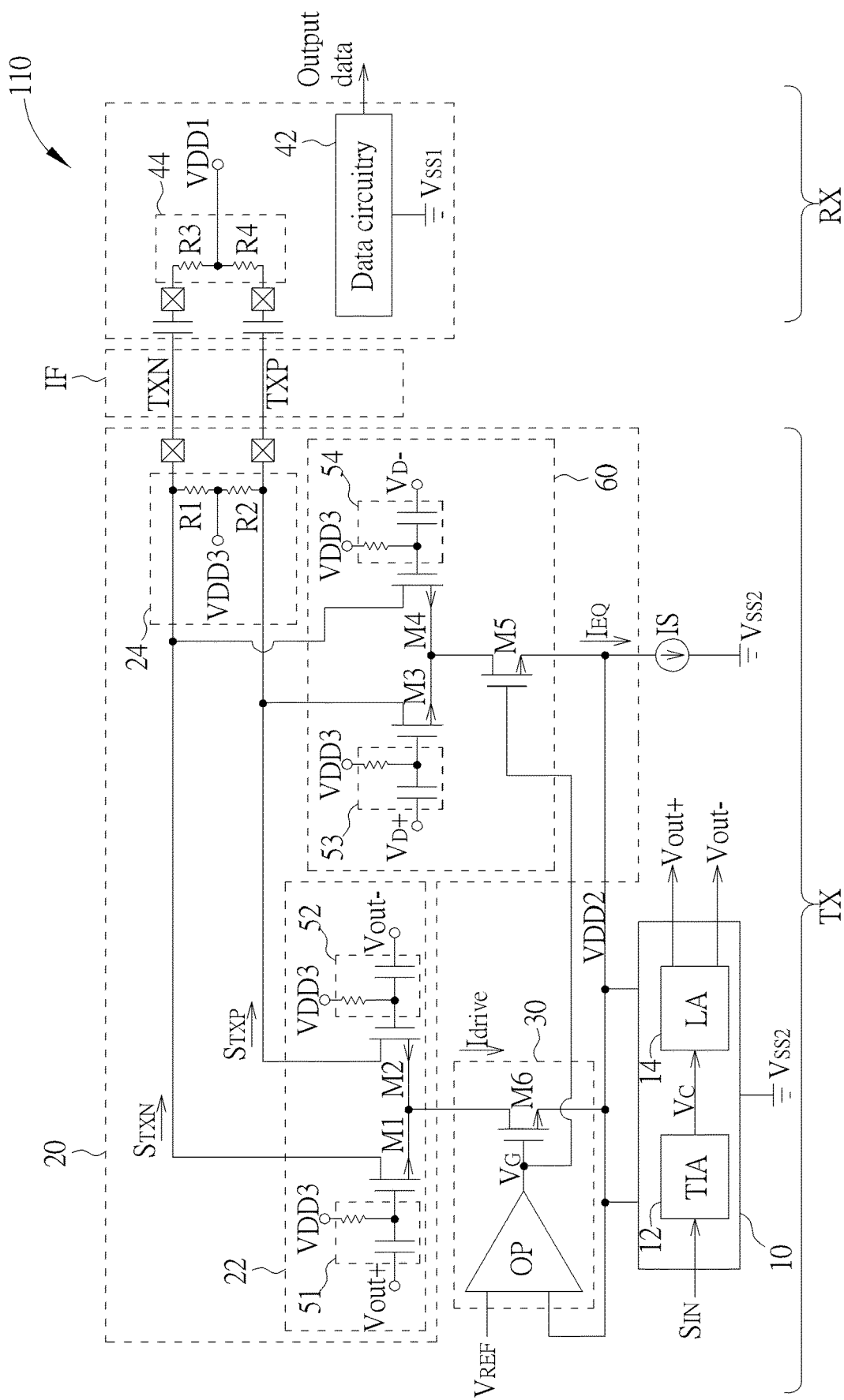
FIG. 10 is a diagram illustrating an AC-coupled interface circuitry with current reuse mechanism.

In the embodiment illustrated in FIGS. 5 and 10, the DC-coupled interface circuitry 105 or the AC-coupled interface circuitry 110 further includes AC coupling units 51-54, an adjustable current source IS, and an equalizer 60, where the AC coupling units 51-54 and the equalizer are implemented in the driving circuit 20. With similar configuration to the DC-coupled interface circuitry 104 or the AC-coupled interface circuitry 109, the equalizer 60 of the DC-coupled interface circuitry 105 or the AC-coupled interface circuitry 110 is configured to perform de-emphasis function on the driving signals $S_{TXP}$ and $S_{TXP}$. With similar configuration to the DC-coupled interface circuitry 103 or the AC-coupled interface circuitry 108, the adjustable current source IS of the DC-coupled interface circuitry 105 or the AC-coupled interface circuitry 110 is configured to regulate the driving current $I_{drive}$ to maintain the data signals $S_{TXN}$ and $S_{TXP}$ operated at predetermined ranges. In the DC-coupled interface circuitry 105 or the AC-coupled interface circuitry 110, the AC coupling unit 51 is configured to allow the transistor M1 to operate within a predetermined range, the AC coupling unit 52 is configured to allow the transistor M2 to operate within at a predetermined range, the AC coupling unit 53 is configured to allow the transistor M3 to operate within at a predetermined range, and the AC coupling unit 54 is configured to allow the transistor M4 to operate within at a predetermined range. Each AC coupling unit in the DC-coupled interface circuitry 105 or the AC-coupled interface circuitry 110 may be implemented using a capacitor and a resistor in similar configuration as illustrated in FIG. 2 or FIG. 7.

In some embodiments, the input stage 10 of the DC-coupled interface circuitry 105 or the AC-coupled interface circuitry 110 further includes a transimpedance amplifier 12 and a limiting amplifier 14. The transimpedance amplifier 12 is configured to covert the input signal $S_{IN}$ in a current form to a voltage signal Vc. The limiting amplifier 14 is configured to covert the voltage signal Vc to the output signals $V_{OUT+}$ and $V_{OUT-}$.

In some embodiments, the supply voltage VDD3 generated between the resistors R1 and R2 can be supplied to other circuits, such as to a band-gap reference circuit or the AC coupling units 51-54. As the AC-coupled interface circuitry 110 is applied in an AC-coupled interface, the supply voltage VDD1 generated from the receiver module RX will not be able to transmit to the transmitter module TX and the supply voltage VDD3 of the AC-coupled interface circuitry 110 is independent from the supply voltage VDD1

In the present disclosure, the interface circuitry with current reuse mechanism is provided, which can be used in either DC-coupled interface or AC-coupled interface. The interface circuitry includes one or more regulators implemented between different functional blocks or within one functional block to reuse the current, such that the power consumption can be saved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. An interface circuitry, comprising:
an interface; and
a transmitter module, comprising:
   an input stage, powered by a regulated voltage, configured to receive an input signal and generate a first output signal and a second output signal;
   a driving circuit, coupled to the interface; configured to drive the interface according to the first output signal and the second output signal and to provide a first data signal, a second data signal and a driving current; and
   a regulator circuit coupled between the input stage and the driving circuit, configured, to provide the regulated voltage according to the driving current.
2. The interface circuitry of claim 1, wherein:
the interface comprises a first signal transmission line and a second signal transmission line; and
the driving circuit comprises:
   a first resistor and a second resistor coupled in series between the first signal transmission line and the second signal transmission line;
   a first transistor, comprising:
      a first end coupled to the first signal transmission line;
      a second end for outputting the driving current; and
      a control end coupled to receive the first output signal; and
   a second transistor, comprising:
      a first end coupled to the second signal transmission line;
      a second end coupled to the second end of the first transistor for outputting the driving current; and
      a control end coupled to receive the second output signal.
3. The interface circuitry of claim 2, wherein the driving circuit further comprises:
a first AC coupling unit configured to allow the first transistor to operate within a first range, comprising:
   a first capacitor, comprising;
      a first end coupled to the control end of the first transistor; and
      a second end coupled to receive the first output signal; and
   a first resistor, comprising:
      a first end coupled to the control end of the first transistor; and
      a second end coupled to receive a first supply voltage; and
a second AC coupling unit configured to allow the second transistor to operate within a second range, comprising:
   a second capacitor, comprising:
      a first end coupled to the control end of the second transistor; and
      a second end coupled to receive the second output signal; and
   a second resistor, comprising:

a first end coupled to the control end of the second transistor; and a second end coupled to receive the first supply voltage.

4. The interface circuitry of claim 1, further comprising an adjustable current source coupled between the regulator circuit and a bias voltage and configured to regulate the driving current.

5. The interface circuitry of claim 3, wherein the first supply voltage is generated between the first resistor and the second resistor of the driving circuit, and supplied to the second end of the first resistor of the first AC coupling unit and the second end of the second resistor of the second AC coupling unit.

6. The interface circuitry of claim 2, wherein the driving circuit further comprises an equalizer configured to provide an equalization current for performing a de-emphasis function on the first data signal and the second data signal and comprising:
a third transistor, comprising:
a first end coupled to the second signal transmission line;
a second end; and
a control end coupled to a first delay signal having a first time delay with respect to the first output signal;
a fourth transistor, comprising:
a first end coupled to the first signal transmission line;
a second end coupled to the second end of the third transistor; and
a control end coupled to a second delay signal having a second time delay with respect to the second output signal; and
a fifth transistor, comprising:
a first end coupled to the second end of the third transistor and the second end of the fourth transistor;
a second end for outputting the equalization current; and
a control end coupled to the regulator circuit.

7. The interface circuitry of claim 6, further comprising an adjustable current source coupled between the regulator circuit and a bias voltage and configured to regulate the driving current.

8. The interface circuitry of claim 6, wherein the driving circuit further comprises:
a first AC coupling unit configured to allow the third transistor to operate within a first range, and comprising:
a first capacitor, comprising;
a first end coupled to the control end of the third transistor; and
a second end coupled to receive the first delay signal; and
a first resistor, comprising;
a first end coupled to the control end of the third transistor; and
a second end coupled to receive a first supply voltage; and
a second AC coupling unit configured to allow the fourth transistor to operate within a second range, and comprising:
a second capacitor, comprising;
a first end coupled to the control end of the fourth transistor; and
a second end coupled to receive the second delay signal; and
a second resistor, comprising;
a first end coupled to the control end of the fourth transistor; and
a second end coupled to receive the first supply voltage.

9. The interface circuitry of claim 8, wherein:
the first supply voltage is generated between the first resistor and the second resistor, and supplied to the second end of the first resistor of the first AC coupling unit and the second end of the second resistor of the second AC coupling unit.

10. The interface circuitry of claim 6, further comprising an adjustable current source coupled between the regulator circuit and a ground voltage and configured to regulate the driving current, wherein the driving circuit further comprises:
a first AC coupling unit configured to allow the first transistor to operate within a first range; and comprising:
a first capacitor, comprising;
a first end coupled to the control end of the first transistor; and
a second end coupled to receive the first output signal; and
a first resistor; comprising;
a first end coupled to the control end of the first transistor; and
a second end coupled to receive a first supply voltage; and
a second AC coupling unit configured to allow the second transistor to operate within a second range, and comprising:
a second capacitor, comprising;
a first end coupled to the control end of the second transistor; and
a second end coupled to receive the second output signal; and
a second resistor, comprising;
a first end coupled to the control end of the second transistor; and
a second end coupled to receive the first supply voltage;
a third AC coupling unit configured to allow the third transistor to operate within a third range, and comprising:
a third capacitor, comprising;
a first end coupled to the control end of the third transistor; and
a second end coupled to receive the first delay signal; and
a third resistor, comprising;
a first end coupled to the control end of the third transistor; and
a second end coupled to receive the first supply voltage; and,
a fourth AC coupling unit configured to allow the fourth transistor to operate within a fourth range, and comprising:
a fourth capacitor, comprising;
a first end coupled to the control end of the fourth transistor; and
a second end coupled to receive the second delay signal; and
a fourth resistor, comprising;
a first end coupled to the control end of the fourth transistor; and
a second end coupled to receive the first supply voltage.

11. The interface circuitry of claim 10, wherein:
the first supply voltage is generated between the first resistor and the second resistor of the driving circuit, and supplied to the second end of the first resistor of the first AC coupling unit, the second end of the second resistor of the second AC coupling unit, the second end of the third resistor and the second end of the fourth resistor.

12. The interface circuitry of claim 1, wherein the regulator circuit comprises:
an operational amplifier configured to provide a control signal according to a relationship between a reference voltage and the regulated voltage, and comprising:
   a first input end coupled to receive the reference voltage;
   a second input end coupled to receive the regulated voltage; and
   an output end for outputting the control signal; and
a sixth transistor, comprising:
   a first end coupled to the driving circuit for receiving the driving current;
   a second end coupled to the input stage for providing the regulated voltage; and
   a control end coupled to the output end of the operational amplifier for receiving the control signal.

13. The interface circuitry of claim 1, wherein the interface is a high-definition multimedia interface (HDMI) interface, a USB interface, a DisplayPort (DP) interface or a peripheral component interconnect express (PCIE) interface.

14. The interface circuitry of claim 1, wherein the interface is a DC-coupled interface or an AC-coupled interface.

15. The interface circuitry of claim 1, further comprising a receiver module coupled to the transmitter module via the interface, and configured to:
receive the first data signal and the second data signal from the transmitter module; and
receive a second supply voltage and transmit the second supply voltage to the transmitter module for supplying an operation of the transmitter module.

16. The interface circuitry of claim 1, further comprising a receiver module coupled to the transmitter module via, the interface and configured to receive the first data signal and the second data signal from the transmitter module, wherein the transmitter module is configured to receive a second supply voltage and transmit the second supply voltage to the receiver module for supplying an operation of the receiver module.

17. The interface circuitry of claim 1, wherein the input stage comprising:
a transimpedance amplifier configured to covert the input signal in a current form into a voltage signal; and
a limiting amplifier configured to covert the voltage signal into the first output signal and the second output signal.

* * * * *